US 6,651,203 B1

(12) United States Patent
Frankowsky

(10) Patent No.: US 6,651,203 B1
(45) Date of Patent: Nov. 18, 2003

(54) ON CHIP PROGRAMMABLE DATA PATTERN GENERATOR FOR SEMICONDUCTOR MEMORIES

(75) Inventor: Gerd Frankowsky, Wappingers Falls, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/312,974

(22) Filed: May 17, 1999

(51) Int. Cl.[7] .................................................. G01R 31/28
(52) U.S. Cl. ................................ 714/738; 365/230.03
(58) Field of Search ................................. 714/738, 733, 714/718, 743, 734, 711, 728, 724, 30, 736; 365/201, 185.11, 185.18, 185.21, 185.33, 230.03, 230.06; 324/158.1, 765; 716/8; 438/264, 529; 257/27.103

(56) References Cited

U.S. PATENT DOCUMENTS

| 5,553,082 A | * | 9/1996 | Connor et al. ............... 714/733 |
| 5,587,960 A | * | 12/1996 | Ferris ...................... 365/189.02 |
| 5,617,328 A | * | 4/1997 | Tsai et al. ....................... 716/8 |
| 5,742,614 A | * | 4/1998 | Cline .......................... 714/719 |
| 5,777,923 A | * | 7/1998 | Lee et al. ............... 365/185.11 |
| 6,122,760 A | * | 9/2000 | Grosch et al. ............... 714/724 |
| 6,357,027 B1 | * | 3/2002 | Frankowsky ................ 714/738 |
| 6,363,510 B1 | * | 3/2002 | Rhodes et al. ........... 324/158.1 |

FOREIGN PATENT DOCUMENTS

| EP | 0 534 187 | | 9/1992 | ........... G06F/11/26 |
| EP | 684571 | * | 11/1995 | ........... G06F/17/50 |
| EP | 0 699 999 | | 3/1996 | ......... G06F/11/273 |
| JP | 04373028 | * | 12/1992 | ........... G06F/11/22 |
| JP | 09007397 | * | 1/1997 | ........... G11C/29/00 |

* cited by examiner

Primary Examiner—Albert Decady
Assistant Examiner—Guy Lamarre
(74) Attorney, Agent, or Firm—Jackson Walker L.L.P.

(57) ABSTRACT

A semiconductor memory chip in accordance with the present invention includes a first memory array to be tested including a plurality of memory cells arranged in rows and columns, the memory cells being accessed to read and write data thereto by employing bitlines and wordlines, the data provided on input/output pins, and a pattern generator formed on the memory chip. The pattern generator further includes a programmable memory array including a plurality of memory banks, the memory banks having memory cells arranged in rows and columns, each bank being capable of storing data for a pattern to be generated for each of the input/output pins of the first memory array. An addressing circuit for accessing the data stored in the programmable memory array to address individual data to be transmitted to and from the first memory array is included.

21 Claims, 3 Drawing Sheets

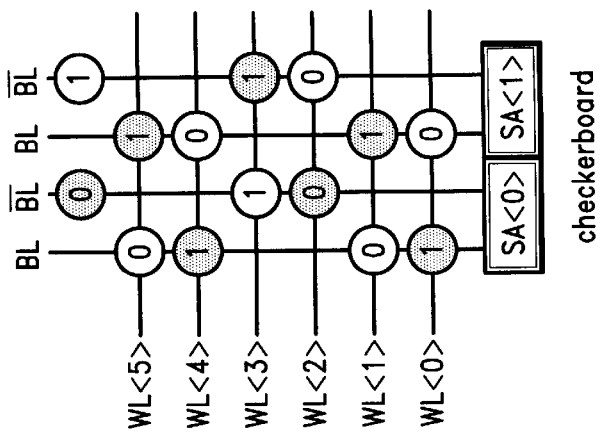
FIG. 1C (PRIOR ART) checkerboard
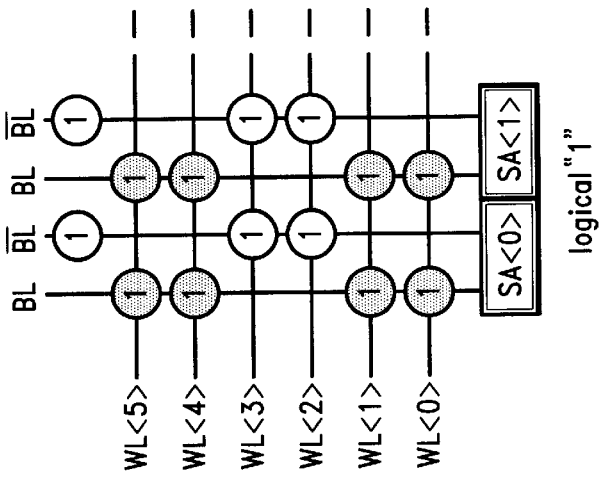
FIG. 1B (PRIOR ART) logical "1"
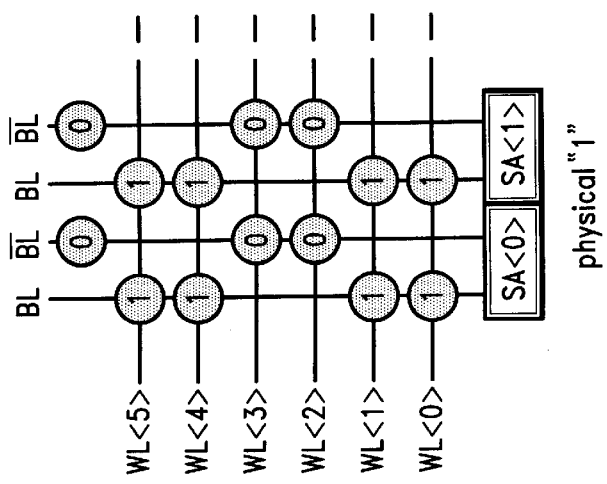
FIG. 1A (PRIOR ART) physical "1"
LEGEND:
- ● charged capacitor
- ○ discharged capacitor
- 1 "1" written/read to/from the DQ
- 0 "0" written/read to/from the DQ

ON CHIP PROGRAMMABLE DATA PATTERN GENERATOR FOR SEMICONDUCTOR MEMORIES

BACKGROUND

1. Technical Field

This disclosure relates to semiconductor memories and more particularly, to an apparatus for testing memory devices using an on chip data pattern generator.

2. Description of the Related Art

The rapid growth in circuit complexity has increased the difficulty and cost of testing memories. Development of high density memories introduces a new dimension in testing complexity. For example, higher speed synchronous DRAMs need includes more complex and more time consuming pattern testing. Using test systems for memory testing may require additional equipment to maintain current levels of throughput. It is typically expensive to add additional testers at to maintain the throughput needed for more complex high-speed memory devices.

Another issue concerning the testing of both the current and future generations of high density memories involves chip frequencies relative to the speed and accuracy of the testers. It is becoming more difficult to find high-speed test systems that can keep up with the chips being tested. Typically, device frequency has been growing faster than the accuracy of testers. At the same time, the test equipment is getting more complex. The pin counts are getting higher and therefore the accuracy needs to be managed over more pins. Further, maintaining costs at a reasonable level and performing the tests in a reasonable time frame are also an issue for manufactures and testers.

In semiconductor memory testing, a chip is tested by writing a known data pattern to memory cells in the array by an external testing device. The data pattern is then read back to the device and compared to the known data pattern. Data patterns may include a physical pattern, a logical pattern and/or a checker pattern, for example. Referring to FIGS. 1A–1C, for semiconductor memory devices, such as dynamic random access memories (DRAMs), bitlines BL and complementary bitlines $\overline{BL}$ (hereinafter BL bar) paired and coupled to a sense amplifier SA. To activate (read from or write to) a memory cell (denoted by circles), a sense amplifier SA and a wordline WL need to be selected. BL and BL bar each have memory cells associated therewith. For example, in FIG. 1A, a physical "1" data pattern is stored as a 1 on memory cells associated with BLs and as a zero on memory cells associated with BL bars. This means all memory cells have charged capacitors. For FIG. 1B, the data pattern is that for a logical "1". In this case, all is are stored in the array which means that half of the memory cells have charged capacitors and half do not. In FIG. 1C, a checkerboard pattern is implemented having alternating is and Os and alternating charged and discharged memory cell capacitors.

As illustrated in FIGS. 1A–1C, physical data corresponds to the content or meaning or the storage capacitor. In the case of a physical 1, the capacitor is charged and for a physical 0, the capacitor is discharged. For logical data, only the value at an input/output pin (DQ) is important. The term logical 1 (0) means if the memory cell is connected to BL or BL bar, a 1 (0) is read/written from/to the I/O-pin. A checkerboard pattern is also a physical data pattern having alternating charged or discharged capacitors. Logical patterns are more easily implemented since the address of the memory cells is not as important as for physical data patterns. For physical data patterns, BL or BL bar connection information is needed to provide appropriate testing. Therefore, address information is needed to correlate BL/BL bar to each memory cell and the data pattern. Due to the address information and the density of memory cells difficulties arise with respect to testing. This is due in part to the number of memory cells and the need to keep track of not only the data pattern addressed to each memory cell but also the locations of failed memory cells.

Chip manufacturing processes are not error free. Therefore each memory chip has to be carefully tested, typically using the data patterns described above. Testing costs are presently a major contributor to overall manufacturing costs of memory chips. The test costs may be reduced either by reducing the time required to test a chip and/or to increase the number of chips tested in parallel. The number of chips tested in parallel is usually limited by the number of input/output (I/O) channels a memory tester can handle. One way to increase the number of chips tested in parallel is to reduce the number of connections between the external tester and the chip under test. Assuming a tester can handle 1024 I/O channels and 130 channels are needed to test one chip, then 7 chips can be tested in parallel.

Therefore, a need exists for an apparatus for testing memory cells to both reduce costs of testing and reduce test time. A further need exists for an apparatus which reduces the number of channels needed to test each chip.

SUMMARY OF THE INVENTION

A semiconductor memory chip in accordance with the present invention includes a first memory array to be tested including a plurality of memory cells arranged in rows and columns, the memory cells being accessed to read and write data thereto by employing bitlines and wordlines, the data provided on input/output pins, and a pattern generator formed on the memory chip. The pattern generator further includes a programmable memory array including a plurality of memory banks, the memory banks having memory cells arranged in rows and columns, each bank being capable of storing data for a pattern to be generated for each of the input/output pins of the first memory array. A means for addressing the data stored in the programmable memory array to address individual data to be transmitted to and from the first memory array is included.

Another semiconductor memory chip includes a first memory array to be tested including a plurality of memory cells arranged in rows and columns, the memory cells being accessed to read and write data thereto by employing bitlines and wordlines, the data provided on input/output pins. A pattern generator is formed on the memory chip. The pattern generator further includes a programmable memory array including a plurality of memory banks, the memory banks having memory cells arranged in rows and columns, each bank being capable of storing data for a pattern to be generated for each of the input/output pins of the first memory array. A means for addressing the data stored in the programmable memory array to address individual data to be transmitted to and from the first memory array is also included. A pattern decoder for selecting a pattern from a plurality of patterns, stored in the memory banks, in accordance with an input signal. Outputs are coupled to the input/output pins of the first memory array to provide the individual data to be transmitted to and from the first memory array.

A DRAM memory chip in accordance with the invention includes a first memory array to be tested including a plurality of memory cells arranged in rows and columns, the memory cells being accessed to read and write data thereto by employing bitlines and wordlines. The data is provided on input/output pins. A pattern generator is formed on the memory chip. The pattern generator further includes a programmable memory array including a plurality of memory banks, the memory banks having memory cells arranged in rows and columns, each bank being capable of storing data for a pattern to be generated for each of the input/output pins of the first memory array. An input means for inputting the pattern data from a source external to the memory chip to the memory banks of the programmable memory is included. The pattern data is provided to the programmable memory prior to testing the memory chip. A means for addressing the data stored in the programmable memory array is included to address individual data to be transmitted to and from the first memory array. A pattern decoder selects a pattern from a plurality of patterns, stored in the memory banks, in accordance with an input signal. Outputs of the pattern generator are coupled to the input/output.pins of the first memory array to provide the pattern data to be transmitted to and from the first memory array.

In alternate embodiments, the means for addressing may be included on or off the semiconductor memory chip. The means for addressing may be provided by an external testing device. The pattern generator may include a pattern address input to select a pattern stored in the programmable memory array. The programmable memory array may include read only memory having pattern data stored therein. The memory chip is preferably a dynamic random access memory chip. The programmable memory array preferably stores a plurality of data patterns, each data pattern of the plurality of data patterns may be stored on a number of memory banks. The addressing means preferably includes wordlines and sense amplifiers to activate the memory cells of the programmable memory array. The pattern to be generated may include a physical pattern, a logical pattern and/or a checker pattern.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIGS. 1A–1C are a top views of memory arrays showing typical data patterns stored in accordance with the prior art;

DETAILED DESCRIPTION OF PREFERRED EMBODIMENTS

The present invention relates to semiconductor memories and more particularly, to an apparatus for testing memory devices using a programmable on chip data pattern generator. The data pattern generator is preferably designed and built as part of the memory chip. The data pattern generator stores an arbitrary data pattern either supplied by a external tester or hard coded directly into the pattern generator. The on chip data pattern generator in accordance with the present invention provides a faster and more efficient method of testing semiconductor memory chips/devices since the data pattern is stored close to the memory cells prior to testing.

Figure 2:
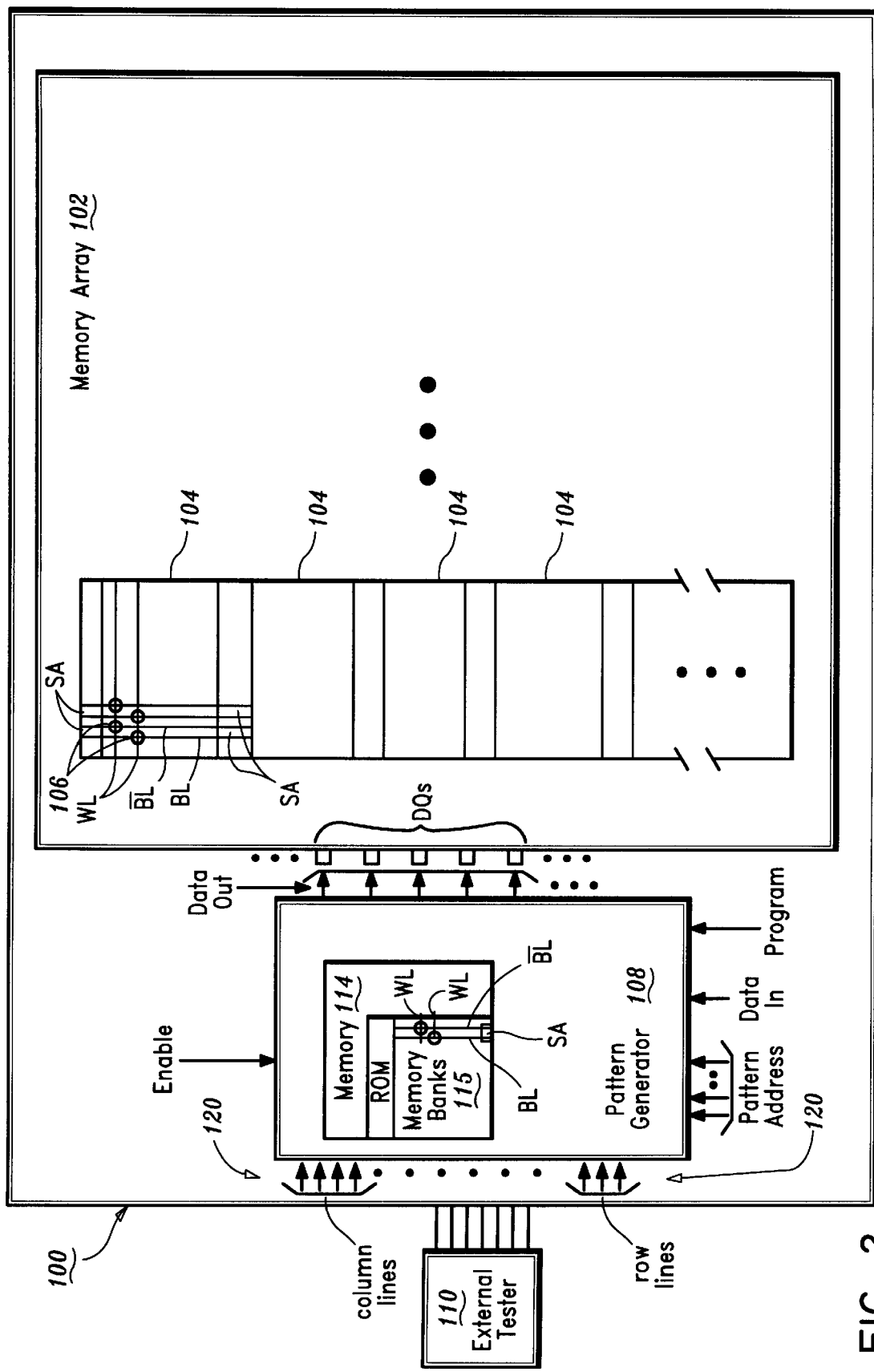
FIG. 2 is a block diagram of a memory device having a pattern generator formed thereon having programmable memory in accordance with the present invention.

Referring now in specific detail to the drawings in which like reference numerals identify similar or identical elements throughout the several views, and initially to FIG. 2, a semiconductor memory device/chip 100 is shown. Semiconductor memory device 100 includes a memory array 102 including a plurality of memory banks 104. Memory banks 104 include memory cells 106 which are accessed using wordlines WL and bitlines BL and BL bar. A pattern generator 108 is included on chip to provide a testing pattern for testing memory cells 106.

Pattern generator 108 may be controlled off chip by an.external tester 110 which may be coupled to pattern generator 108 by, for example a serial interface 112. The pattern generator 108 may be activated/deactivated by setting or resetting a test mode of operation. This may be performed using an enable switch or enable signal supplied on Enable line. Enable permits pattern generator 108 to output data patterns, such as those shown in FIG. 1, to be transmitted to memory array 102 through Data Out lines. Data Out lines are coupled to input/output (I/O) pins or DQs of memory chip 100.

Data-In and Program lines permit direct access to memory 114 of pattern generator 108. Pattern generator 108 may include read only memory or erasable memory or both. Data-In permits pattern data to be input and stored in memory 114 until it is transmitted into memory array 102 for testing memory cells 106. Program permits programming operations to write or rewrite to memory 114. Pattern Address lines permit specific patterns to be entered and programed into pattern generator 108. Pattern Address is employed to select a pattern in which to write data to memory cells 106.

Memory address lines 120 include row address lines and column address lines. Memory address lines 120 supply locations within memory 114 of memory cells to be written from by pattern generator 108 to memory cells 106 of array 102. Pattern generator 108 manages the address information to write pattern data to memory cells 106 in accordance with the pattern specified, for example, a physical pattern (see FIGS. 1A and 1C) or a logical pattern (see FIG. 1B), and the pattern data. The pattern topology (physical data scrambling or arrangement of data within memory array 102) is controlled by a subset of row and column addresses supplied to pattern generator 108 through row lines and column lines of memory address lines 120. In one embodiment, only a single bit (1 or 0) is needed on row lines of memory address lines 120 to provide row address data scrambling as illustrated in FIG. 1. Two or three bits (1s and/or 0s) may be needed on column lines of memory address lines 120 to provide column address data scrambling as illustrated in FIG. 1. The actual number of bits for row/column data scrambling may be varied according to the chip architecture.

Figure 3:
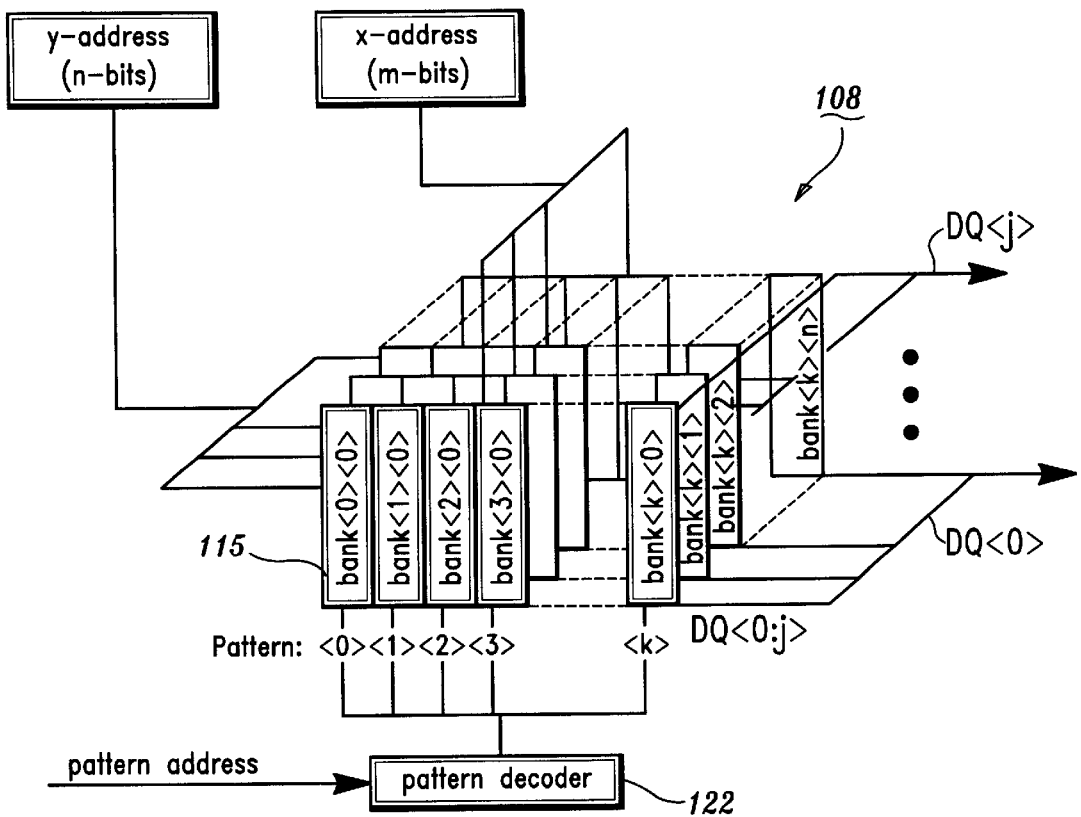
FIG. 3 is a schematic diagram of the pattern generator of FIG. 2 showing memory banks and a pattern decoder in accordance with the present invention.

Referring to FIG. 3, on chip pattern generator 108 is shown schematically in greater detail. Memory 114 of pattern generator 108 includes a plurality of memory banks 115, each of which includes information on a specific pattern, i.e. pattern <0>, pattern <1>, . . . or pattern <k>, an x address <x> for row information, all y addresses y <0:n−1>for column information and all data to be input/output to memory array 102 by DQ <0:j>. A pattern address is input to a pattern decoder 122 to select a specific pattern i.e. pattern <0>, pattern <1>, . . . or pattern <k>. Banks 115 are labeled in FIG. 3 according to the following convention: a bank is identified by a pattern (0–k) and a y address (0–n). For example, bank <k> <n> designates a pattern k, which may include a physical pattern or any other desired pattern, and a column n.

Figures 4, 5:
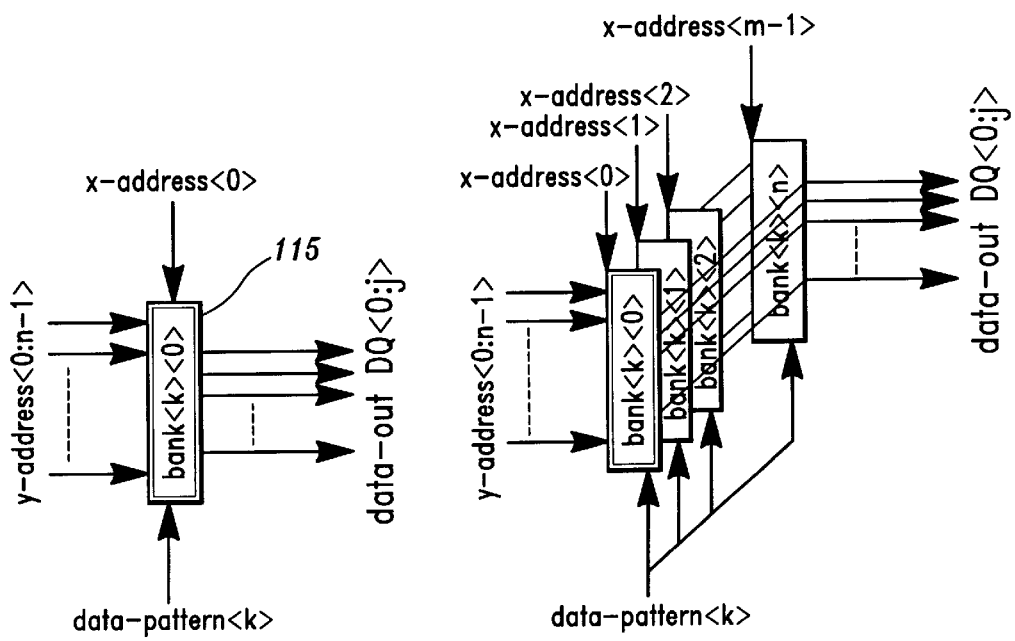
FIG. 4 is a schematic diagram of a memory bank of the pattern generator of FIG. 3 in accordance with the present invention.
FIG. 5 is a schematic diagram of a set of memory banks for storing a complete pattern for the pattern generator of FIG. 3 in accordance with the present invention.

Referring to FIG. 4, a single bank <k> <0> is shown to illustrate banks 115 in greater detail. Bank <k> <0> receives an input signal, data pattern <k>, from pattern decoder 122 (FIG. 3), to enable bank <k> <0>. Bank <k><0> stores information for data pattern <k> to be transmitted to memory array 102 (FIG. 2). Bank <k> <0> includes data to be output from bank <k> <0> through data-out for all data lines DQ <0:j> for a single x address (row address) and the entire y address (column address) space. Other storage arrangements are contemplated, for example, each bank 115 may include information for all data lines DQ <0:j> for a single y address (column address) and the entire x address (row address) space. For example, j may be equal to 4, 8, 16, 32, 64 or multiples thereof.

Referring to FIG. 5, banks <k> <0:n> are shown to further illustrate the arrangement of on chip pattern generator 108 in accordance with the present invention. A set of banks <k> <0:n> includes information for a complete data pattern for the entire address space i.e., x-address <0:m−1> and y-address <0:n−1> where m and n are the number of bits needed for the pattern in the x and y direction, respectively.

Referring again to FIG. 2, banks 115 may include storage space sufficient to store enough data for a complete pattern for a smallest repeatable pattern to be transmitted to memory array 102. Likewise, banks 115 may include storage space sufficient to store enough data for a complete pattern for an arbitrarily sized pattern to be transmitted to memory array 102. It is possible to fabricate pattern generator memory 114 in a similar way as memory array 102. For example, memory 114 includes sense amplifiers SA, bitlines BL (BL bar) and wordlines WL as shown in FIG. 1. In this way, y-addresses are employed to activate memory cells in memory 114 corresponding to wordlines while x-addresses are employed to activate sense amplifiers SA. The pattern generator 108 has structures, such as, sense amplifiers SA, bitlines BL (BL bar) and wordlines WL, formed simultaneously with the corresponding structures of memory array 102.

Pattern Address signals may be generated on the chip or by external tester 110. The more patterns stored in memory 114 the more Pattern Address lines are needed. For example, if 8 different data patterns are to be stored then 3 different address bits are needed. Further, address signals on memory address lines 120 may be generated on or off chip. Memory 114 may include read only memory having preprogrammed patterns stored therein for use.

To implement a test employing pattern generator 108 in accordance with the present invention, a pattern is selected to by choosing a test mode to be used for the test. This is input as a pattern address to pattern decoder 122 which selects memory banks 115 having the data corresponding to the selected pattern therein. The x-address which may be generated on or off chip is used to select a single bank and the y-address determined the data set to provide to the pattern generator output. To conserve chip area, circuitry for pattern generator may be reduced to a single, programmable data pattern. Each time a new pattern is needed it is downloaded into memory 114 of pattern generator 108. In other embodiments, pattern data may be mixed, i.e., several patterns used for a single test, for example a checkerboard pattern and a ripple pattern may be used at arbitrarily selected locations to provide the test pattern for the memory array 102.

EXAMPLE

The following Example illustratively describes a pattern generator in accordance with the present invention for a 16 bit DRAM chip. For a 16 bit chip DQs 0–15 are included. For this example, memory architecture permits a pattern with 2 column bits, i.e., n=2, and 4 bits in the row direction, i.e., m=4. Also, 8 patterns are desired to be stored in the patten generator memory, then k=7 (0–7 is 8 patterns). (WLs are decoded from the row address, m) m and n are related to the smallest repeatable structure in the array in terms of topology. It is desired to write a checkerboard pattern (See FIG. 1C). The pattern generator has to provide the 0's and 1's of the pattern. Referring to FIG. 1C, in the case of activating sense amp SA <0>, the y-address would be 0, and x-address (WL) is also 0, and a 1 is applied to the bitline BL. Now, if the x-address is changed from 0 to 1 (to WL <1>), a 0 is needed at the output of the pattern generator. From WL <0> to WL <1> 1, the same y-address is used.

For the pattern of FIG. 1C, the information that the pattern generator has to write, includes a 1,0,0,1 pattern. In this case, for a fixed y-address 4 bits in the x-direction are needed. Then, the pattern repeats itself. These four 4 bits are stored in the memory of pattern generator already. 2 bits are needed for the y-direction because the pattern for SA <0> is different from the pattern of SA <1>. m and n (4×2) is the smallest unique pattern in this example. Advantageously, pattern generator stores this smallest repeatable pattern which is repeated by simply changing the address to read/write the pattern in memory cells of the DRAM chip.

In the example described above, an external tester can handle 1024 I/O channels and 130 channels are needed to test one chip, therefore 7 chips can be tested in parallel in the prior art. By incorporating a pattern generator in accordance with the present invention, channels normally used for pattern generation become available. For example, about 31 channels are available per chip. This means the tester may now test 10 chips in parallel thereby increasing throughput for acceptance testing of memory chips.

Having described preferred embodiments for on chip programmable data pattern generator for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory chip comprising:
   a first memory array to be tested including a plurality of memory cells arranged in rows and columns, the memory cells being accessed to read and write data thereto by employing bitlines and wordlines, the data being provided on input/output pins; and
   a pattern generator formed on the memory chip, the pattern generator further comprising:

a programmable memory array including a plurality of memory banks, the memory banks having memory cells arranged in rows and columns, each bank being capable of storing data for a pattern to be generated for each of the input/output pins of the first memory array; and means for addressing the pattern data stored in the programmable memory array to address individual pattern data to be transmitted to and from the first memory array on input/output pins.

2. The semiconductor memory chip as recited in claim 1, wherein the means for addressing is included on the semiconductor memory chip.

3. The semiconductor memory chip as recited in claim 1, wherein the means for addressing is provided by an external testing device.

4. The semiconductor memory chip as recited in claim 1, wherein the pattern generator includes a pattern address input to select a pattern stored in the programmable memory array.

5. The semiconductor memory chip as recited in claim 1, wherein the programmable memory array includes read only memory having pattern data stored therein.

6. The semiconductor memory chip as recited in claim 1, wherein the memory chip is a dynamic random access memory chip.

7. The semiconductor memory chip as recited in claim 1, wherein the addressing means includes wordlines and sense amplifiers to activate the memory cells of the programmable memory array.

8. The semiconductor memory chip as recited in claim 1, wherein each data pattern of the plurality of data patterns is stored on a number of memory banks.

9. The semiconductor memory chip as recited in claim 1, wherein the pattern to be generated is one of a physical pattern, a logical pattern and a checker pattern.

10. A semiconductor memory chip comprising:

a first memory array to be tested including a plurality of memory cells arranged in rows and columns, the memory cells being accessed to read and write data thereto by employing bitlines and wordlines, the data being provided on input/output pins; and a pattern generator formed on the memory chip, the pattern generator further comprising:

a programmable memory array including a plurality of memory banks, the memory banks having memory cells arranged in rows and columns, each bank being capable of storing data for a pattern to be generated for each of the input/output pins of the first memory array;

means for addressing the data stored in the programmable memory array to address individual pattern data to be transmitted to and from the first memory array on input/output pins;

a pattern decoder for selecting a pattern from a plurality of patterns, stored in the memory banks, in accordance with an input signal; and outputs of the pattern generator coupled to the input/output pins of the first memory array to provide the individual pattern data to be transmitted to and from the first memory array on input/output pins.

11. The semiconductor memory chip as recited in claim 10, wherein the means for addressing is included on the semiconductor memory chip.

12. The semiconductor memory chip as recited in claim 10, wherein the means for addressing is provided by an external testing device.

13. The semiconductor memory chip as recited in claim 10, wherein the input signal is provided from an external source off the memory chip.

14. The semiconductor memory chip as recited in claim 10, wherein the programmable memory array includes read only memory having pattern data stored therein.

15. The semiconductor memory chip as recited in claim 10, wherein the memory chip is a dynamic random access memory chip.

16. The semiconductor memory chip as recited in claim 10, wherein each of the plurality of patterns is stored on a number of memory banks.

17. The semiconductor memory chip as recited in claim 10, wherein the pattern to be generated is one of a physical pattern, a logical pattern and a checker pattern.

18. A DRAM memory chip comprising:

a first memory array to be tested including a plurality of memory cells arranged in rows and columns, the memory cells being accessed to read and write data thereto by employing bitlines and wordlines, the data provided on input/output pins; and a pattern generator formed on the memory chip, the pattern generator further comprising:

a programmable memory array including a plurality of memory banks, the memory banks having memory cells arranged in rows and columns, each bank being capable of storing data for a pattern to be generated for each of the input/output pins of the first memory array;

input means for inputting the pattern data from a source external to the memory chip to the memory banks of the programmable memory, the pattern data being provided prior to testing the memory chip;

means for addressing the data stored in the programmable memory array to address individual data to be transmitted to and from the first memory array;

a pattern decoder for selecting a pattern from a plurality of patterns, stored in the memory banks, in accordance with an input signal; and outputs coupled to the input/output pins of the first memory array to provide the individual data to be transmitted to and from the first memory array.

19. The semiconductor memory chip as recited in claim 18, wherein the programmable memory array includes read only memory having pattern data stored therein.

20. The semiconductor memory chip as recited in claim 18, wherein the means for addressing is included on the semiconductor memory chip.

21. The semiconductor memory chip as recited in claim 18, wherein the input signal is provided from an external source off the memory chip.

* * * * *